United States Patent
Mullarkey

(10) Patent No.: US 6,252,816 B1
(45) Date of Patent: Jun. 26, 2001

(54) CIRCUIT AND METHOD FOR REFRESHING DATA STORED IN A MEMORY CELL

(75) Inventor: Patrick J. Mullarkey, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/564,303

(22) Filed: May 3, 2000

Related U.S. Application Data

(62) Division of application No. 09/293,195, filed on Apr. 16, 1999.

(51) Int. Cl.[7] ................................................. G11C 7/00
(52) U.S. Cl. .............................................................. 365/222
(58) Field of Search ..................................... 365/222, 207, 365/149, 233

(56) References Cited

U.S. PATENT DOCUMENTS 4,616,346 * 10/1986 Nakaizumi et al. ................. 365/229
5,349,562 * 9/1994 Tanizaki ................................ 365/222
5,467,315 * 11/1995 Kajimoto et al. ..................... 365/222
5,835,401 * 11/1998 Green et al. .......................... 365/149

* cited by examiner

Primary Examiner—Vu A. Le
Assistant Examiner—Anh Phung
(74) Attorney, Agent, or Firm—Michael L. Lynch; Graybeal Jackson Haley LLP

(57) ABSTRACT

An IC includes a memory array that has memory cells for storing data and that refreshes the data stored in a memory cell during a respective refresh cycle of a refresh mode. The integrated circuit also includes a refresh circuit that during a first portion of the refresh mode implements a first series of refresh cycles in the memory array at a first frequency and that during a second portion of the refresh mode implements a second series of refresh cycles in the memory array at a second frequency. Such a refresh circuit allows longer internal row-line on times during a self-refresh mode without affecting the auto-refresh TRC, which is the specified maximum time that the IC requires to execute an auto-refresh cycle. Therefore, the IC can consume less power during a self-refresh mode and still meet the same auto-refresh specification.

15 Claims, 9 Drawing Sheets

CIRCUIT AND METHOD FOR REFRESHING DATA STORED IN A MEMORY CELL

CROSS-REFERENCE TO RELATED APPLICATION

This application is a divisional of the application Ser. No. 09/293,195 filed Apr. 16, 1999.

TECHNICAL FIELD

The invention relates generally to integrated circuits (ICs), and more particularly to an IC that includes an improved circuit and implements an improved method for refreshing data stored in a memory cell. Such a circuit and method allow a significant decrease in the refresh frequency, and thus a significant decrease in power consumption, while the IC is in a self-refresh mode.

BACKGROUND OF THE INVENTION

System designers continually push IC manufactures to design ICs, such as volatile-memory ICs, that have lower power requirements, particularly during low-power, i.e., "sleep", modes. Unfortunately, as discussed below, it is difficult for IC manufacturers to reduce the sleep-mode power consumed by ICs that include volatile memory cells.

Because the data stored in a volatile memory cell—such as a dynamic-random-access-memory (DRAM) cell—degrades relatively quickly, the data must be periodically refreshed. Therefore, an IC that includes one or more volatile memory cells periodically implements refresh cycles.

During a typical refresh cycle, a sense amplifier reads the data stored in the memory cell and then writes the same data back into the cell. More specifically, the cell stores a signal level, such as a voltage level, that represents the value of the stored data. For example, a voltage level of Vdd often represents a data value of logic 1, and a voltage level of ground (0 V) often represents a data value of logic 0. Unfortunately, well-known phenomena such as memory-cell leakage cause this signal level to decay over time. If this signal level is not maintained, then It may decay to a point where it represents a data value different than the data value originally stored in the memory cell. For example, a voltage level of Vdd (logic 1) may decay toward 0 V (logic 0), and if not maintained, may eventually become close enough to 0 V to represent logic 0 instead of logic 1. To maintain the stored signal level, the IC containing the memory cell implements a refresh cycle during which the sense amplifier receives the signal level from the cell, amplifies the signal level to its full value (Le., Vdd for logic 1 and 0 V for logic 0), and provides the full signal level to the cell for storage.

During normal operation of an IC that contains a volatile memory cell, the electronic system incorporating the IC periodically issues an auto-refresh command to refresh the cell. For example, the IC may include multiple rows of memory cells and a refresh address counter that indicates the row to be refreshed. Each auto-refresh command causes the IC to implement a respective auto-refresh cycle during which the IC refreshes the cells in the addressed row and increments or decrements the counter by one. After all of the rows have been refreshed, the counter "turns over" so that the IC can continue to refresh the rows.

To insure that the system issues auto-refresh commands frequently enough to prevent the memory cells from losing their respective data, the IC manufacturer specifies the maximum refresh period that can elapse between successive refreshes of a memory cell. For example, suppose that the IC must refresh each memory cell at least once every 64 milliseconds (ms), includes 4,096 (4 k) rows of memory cells, and refreshes an entire row during each refresh cycle. Then, to insure that no memory cells lose their respective data, the system must execute at least 4,096 auto-refresh commands (one for each row) every 64 ms. The system can issue these auto-refresh commands all at once (burst auto refresh), or can distribute them over the 64 ms refresh period (distributed auto refresh).

Furthermore, to insure that the refresh cycles are long enough to allow the IC to adequately refresh a memory cell, the IC manufacture specifies the minimum duration that the system must allow for each refresh cycle. Therefore, once the system issues an auto-refresh command, it must wait at least this minimum duration before issuing another command to the IC. For example, if the IC takes 70 nanoseconds (ns) to implement a refresh cycle, then the system must wait at least 70 ns after issuing an auto-refresh command before issuing another command to the IC.

To increase the speed rating—and thus the price—of the IC, the manufacturer often specifies the shortest possible duration for each refresh cycle. Often, this duration is too short to allow the IC to refresh a memory cell to its full signal level. As discussed below, this may require the IC manufacturer to specify a shorter refresh period between successive refreshes of a memory cell. Also as discussed below, a shorter refresh period requires the memory to issue internal refresh commands more frequently during the self-refresh mode, and thus may cause the IC to draw more power during a self-refresh mode.

FIG. 1 is a plot of the broken-line charge/discharge curves 10 and 12 for a memory cell that the IC only partially refreshes. That is, the IC implements a refresh cycle that is too short to allow the memory cell to acquire a full signal level. In this example, Vdd/2 is the threshold level between logic 1 and logic 0. Referring to the curve 10, at time t1, a memory cell storing a logic 1—which here corresponds to Vdd—is coupled to the respective digit line to begin the refresh cycle. Because the digit line is capacitive, the cell voltage drops and the digit-line voltage—which is represented by the solid curve 11—rises to a starting voltage Vs1. Furthermore, because the digit-line capacitance is approximately five times greater than the cell capacitance, the cell voltage drops more than the digit-line voltage rises. Starting at time t2, the IC charges the memory cell over a refresh time Trefresh. Typically, Trefresh is a portion of the total refresh-cycle time. For example, if the refresh-cycle time is 70 ns, Trefresh may be 60 ns. As shown, Trefresh isn't long enough for the IC to fully charge the memory cell to Vdd. Consequently, the IC can only partially charge the memory cell to V1, which is lower than Vdd. For example, V1 may be 100–300 millivolts (mV) lower than Vdd. After Trefresh elapses, the memory cell discharges to Vdd/2 over a discharge time Tdischarge, which is proportional to V1. Thus, the higher V1, the longer Tdischarge, and the lower V1, the shorter Tdischarge. The shorter Tdischarge, the more frequently the IC must refresh the signal level stored in the memory cell, and thus the shorter the maximum refresh period that the IC manufacturer can specify. A similar analysis applies to the curves 12 and 13, which corresponds to the memory cell storing logic 0.

During low-power operation of the system such as during a "sleep" mode, the system issues a self-refresh command that causes the IC to enter a self-refresh mode. During a self-refresh mode—which is typically a low-power mode of the IC—the IC typically ignores all system commands (other than a "wake-up" command) and performs few if any functions other than automatically refreshing the memory cells. Because it ignores auto-refresh commands during the self-refresh mode, the IC includes self-refresh circuitry that automatically implements self-refresh cycles during the self-refresh mode. Except for the automatic implementation, the self-refresh cycles are similar to auto-refresh cycles.

FIG. 2 is a plot of the peak and average currents that the IC draws during a self-refresh mode. The peak current Ipeak is the total refresh current that the IC draws during a respective self-refresh cycle to recharge the memory cell or cells being refreshed. Each self-refresh cycle has the refresh time Trefresh during which the IC draws the refresh current. And in this example, the self-refresh cycles are evenly distributed throughout the self-refresh period, one every Trefper seconds. For example, Trefresh=60 ns and Trefper= 20 microseconds ($\mu s$). The average current Iavg is proportional to Ipeak, Trefresh, and the IC's power consumption, and is inversely proportional to Trefper.

To save power in the self-refresh mode, the IC designers often reduce the average current Iavg by designing the IC to implement the longest possible self-refresh period between successive self-refreshes of a memory cell. Typically, the designers can lengthen the self-refresh period beyond the specified auto-refresh period, and thus can lengthen Trefper beyond the maximum time specified between evenly distributed auto-refresh cycles. For example, using the above values, if the specified maximum auto-refresh period is 64 ms, then an evenly distributed auto refresh requires one auto-refresh cycle every (64 ms/4096 rows)=15.6 $\mu s$. The designers, however, may design the IC such that the self-refresh period is approximately 82 ms, which corresponds to Trefper—20 $\mu s$ during a self-refresh mode.

Unfortunately, because during normal operation the short auto-refresh cycles prevent the IC from fully refreshing the stored data, the IC designers cannot further lengthen Trefper without risking data corruption during the self-refresh mode.

SUMMARY OF THE INVENTION

In one aspect of the invention, an IC includes a memory array having memory cells for storing data. The memory array refreshes the data stored in each memory cell during a respective refresh cycle of a refresh mode. The IC also includes a refresh circuit that is coupled to the memory array, that during a first portion of the refresh mode implements a first series of refresh cycles in the memory array at a first frequency, and that during a second portion of the refresh mode implements a second series of refresh cycles in the memory array at a second frequency.

In another aspect of the invention, an IC includes a memory array and refresh circuit. During a first refresh mode, the refresh circuit implements in the memory array a refresh cycle having a refresh portion of a first duration, and during a second refresh mode the refresh circuit implements a refresh cycle having a refresh portion of a second duration.

Thus, such an IC can achieve a high-speed rating by implementing relatively fast auto-refresh cycles during normal operation and can achieve power savings during a self-refresh mode by implementing longer Trefper times between self-refresh cycles.

DETAILED DESCRIPTION OF THE INVENTION

Figure 2:
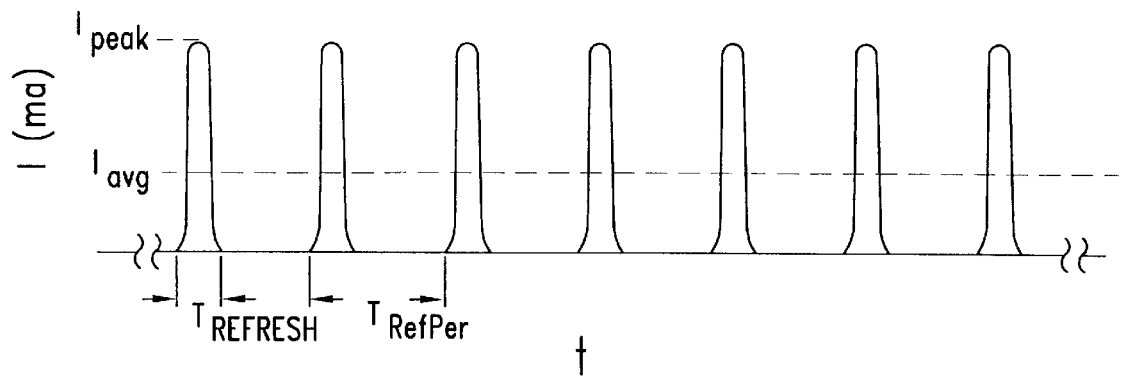
FIG. 2 is a graph of the peak and average currents drawn by a conventional IC during a self-refresh mode.
Figure 3:
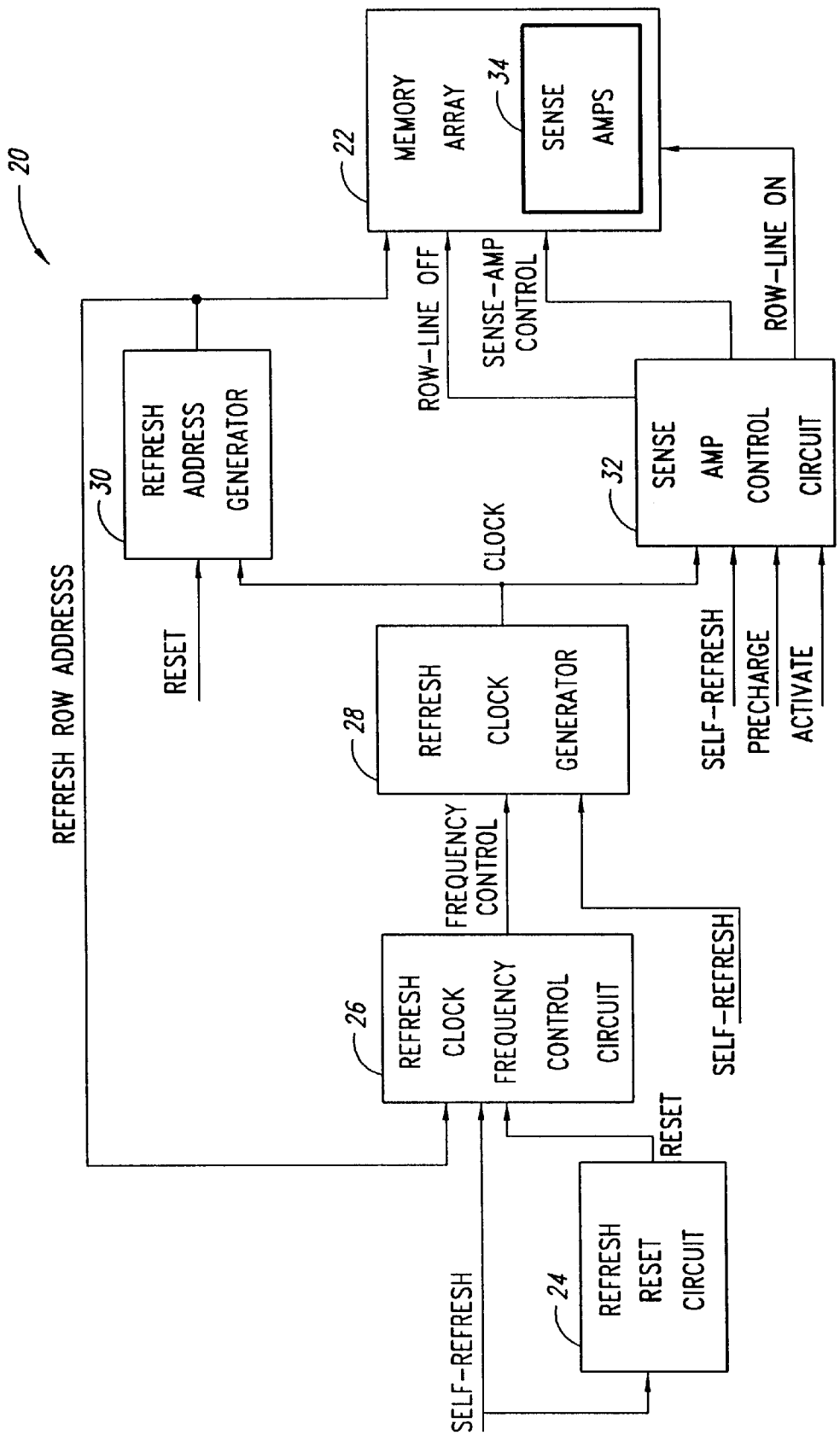
FIG. 3 is a block diagram of a refresh circuit and a memory array according to an embodiment of the invention.

FIG. 3 is a block diagram of refresh circuit 20 for implementing a self-refresh mode in a memory array 22. Typically, the circuit 20 and the array 22 are part of an IC that receives a SELF-REFRESH signal from the system in which it is installed. The circuit 20 implements a self-refresh mode that has an initial burst portion to fully refresh all of the memory cells in the array 22 and that has a subsequent maintenance portion to refresh the cells at the maximum possible self-refresh period. Thus, as discussed below, the circuit 20 allows a significant increase in Trefper (FIG. 2), and thus provides a significant power savings, during the maintenance portion of the self-refresh mode.

The circuit 20 includes a reset circuit 24 for generating a REFRESH signal in response to SELF-REFRESH.

A refresh clock-frequency control circuit 26 generates a FREQUENCY CONTROL signal that has a first state during the initial burst portion of the self-refresh mode and that has a second state during the subsequent maintenance portion of the self-refresh mode. A refresh clock generator 28 generates a CLOCK signal that has a relatively high burst frequency during the burst portion of the self-refresh mode and a relatively low maintenance frequency during the maintenance portion. The CLOCK signal, however, is not the same as the external clock signal received by the IC that incorporates the refresh circuit 20. Therefore, "CLOCK" refers to the signal generated by the generator 28 unless stated otherwise.

A refresh address generator 30 addresses the memory cell, row of memory cells, or column of memory cells to be refreshed during a respective self-refresh cycle. In one embodiment, the generator 30 is a counter that resets to an initial address at the beginning of the self-refresh mode and then increments/decrements the address once during each period of CLOCK.

Figure 1:
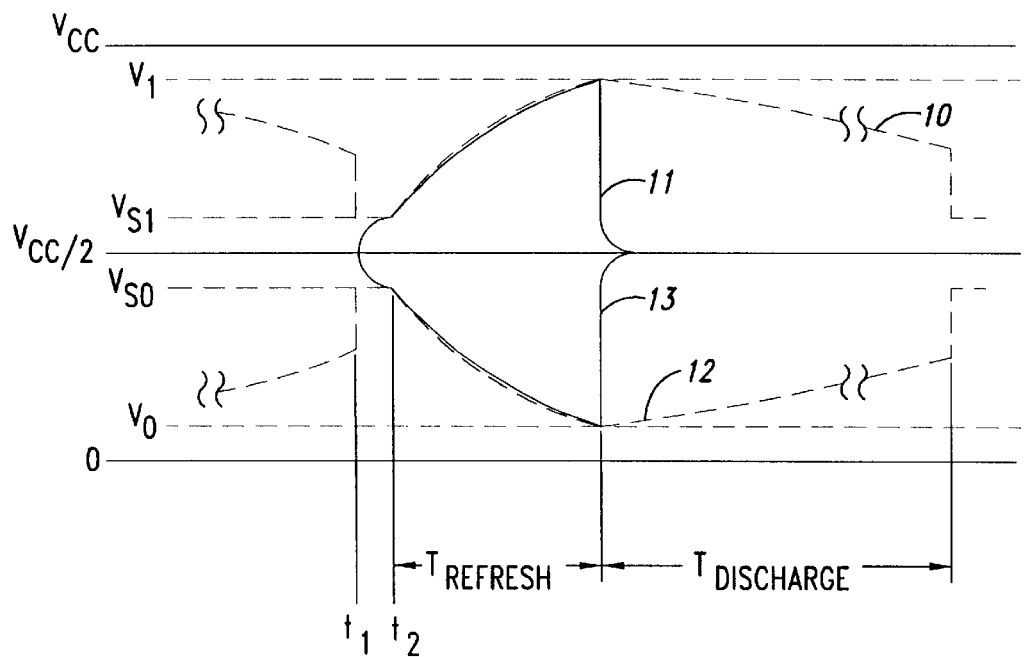
FIG. 1 is a graph of the charge/discharge curves for a memory cell that is only partially refreshed during a conventional refresh cycle.

A sense-amplifier control circuit 32 controls the length of the Trefresh (FIG. 1 and FIG. 4).time during self-refresh to allow full refresh of the memory cells in the array 22. In some embodiments, the control circuit 32 may also control the length of the Trefresh time during auto-refresh, and may control the sense-amplifier on time during read and write cycles. Specifically, during a self-refresh mode, the control circuit 32 activates the respective ones of the sense amplifiers 34 in the memory array 22 for a predetermined Trefresh time during each self-refresh cycle Trefper. Trefper is synonymous with the self-refresh cycle in this disclosure. In one embodiment, the control circuit 32 activates the respective sense amplifiers 34 for a Trefresh time of approximately 80 ns during each Trefper such that these sense amplifiers have sufficient time to fully refresh the respective memory cells. In an embodiment where the control circuit 32 also controls the length of the Trefresh time during an auto-refresh cycle, the control circuit 32 activates the sense amplifiers 34 for a Trefresh time that is significantly shorter than the Trefresh time during the self-refresh mode. For example, the auto-refresh Trefresh time may be 60 ns, which may be insufficient to allow the sense amplifiers 34 to fully refresh the respective memory cells. This shorter auto-refresh Trefresh time, however, allows the IC to achieve a higher speed rating by decreasing the auto-refresh cycle time. That is to say, the auto-refresh is completed sooner and the IC is ready for a new instruction.

Figure 4:
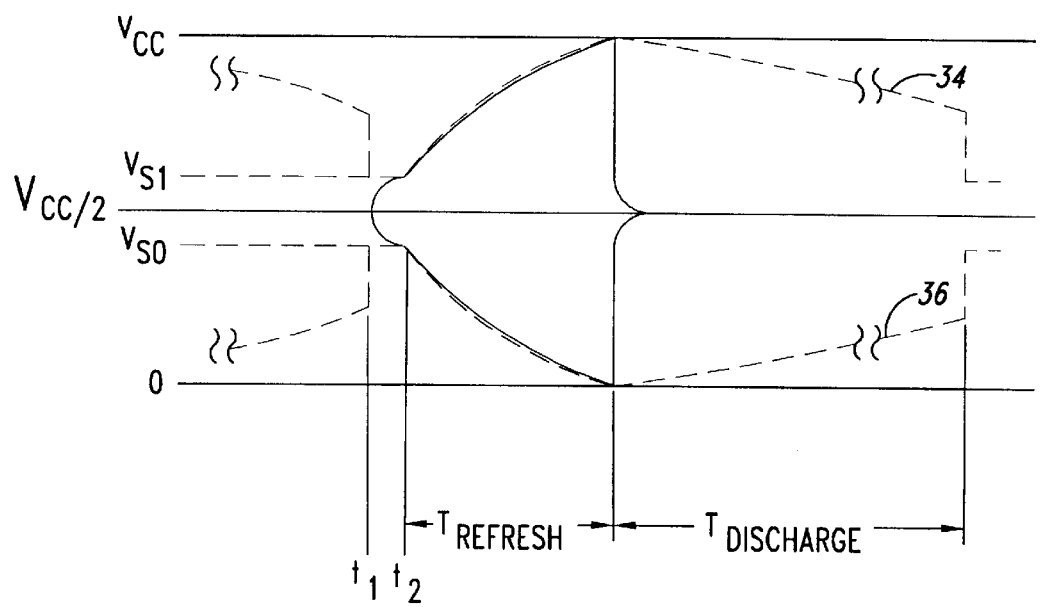
FIG. 4 is a graph of the charge/discharge curves for a memory cell that is refreshed by the refresh circuit of FIG. 3 during a self-refresh mode.

FIG. 4 is a graph of charge/discharge curves 34 and 36 for a memory cell of the array 22 (FIG. 3) that is fully refreshed during a self-refresh cycle implemented by the refresh circuit 20 (FIG. 3). Fully refreshing the memory cell significantly increases Tdischarge, and thus allows the refresh circuit 20 to significantly increase the distributed self-refresh refresh Trefper during the maintenance portion of the self-refresh mode.

Figure 5:
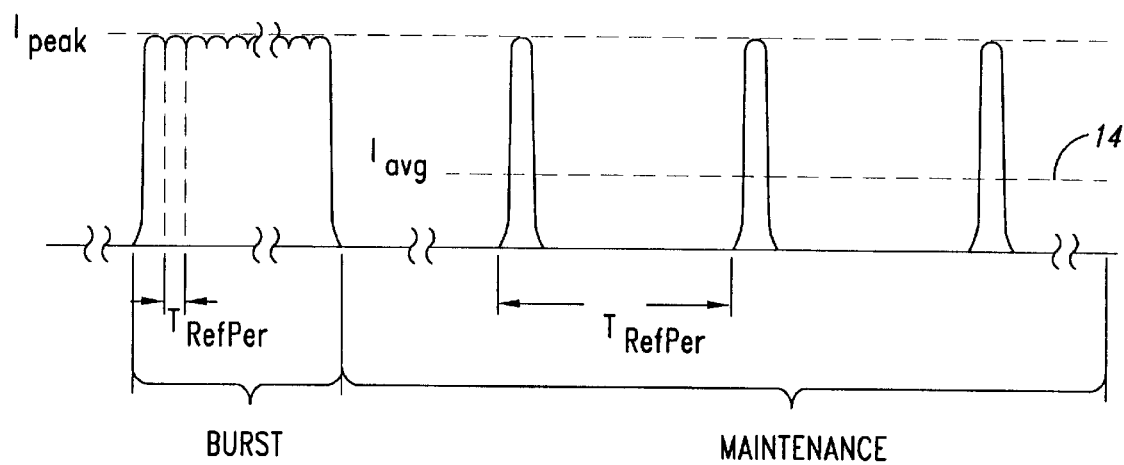
FIG. 5 is a graph of the peak burst, peak maintenance, and average currents drawn during a self-refresh mode by an IC that includes the refresh circuit of FIG. 3.

FIG. 5 is a graph of the peak current Ipeak during the burst and maintenance portions of the self-refresh mode implemented by the circuit 20 (FIG. 3) and the average current Iavg during the maintenance portion. During the initial burst portion, the circuit 20 implements one self-refresh cycle after another to fully refresh all the memory cells fast enough to prevent corruption of the stored data. For example, if the Trefresh time of each cycle is 80 ns as discussed above, then each refresh cycle Trefper is approximately 90–100 ns. For 4096 rows, the burst portion is thus approximately 400 $\mu$s long, which is fast enough to prevent data loss. During the subsequent maintenance portion of the self-refresh mode, because the cells are now fully refreshed, the distributed self-refresh cycle time Trefper is maximized to lower Iavg and thus the power consumed by the IC. For example, in one embodiment, Trefper for the circuit 20 is approximately 30 $\mu$s as compared to approximately 20 $\mu$s for prior-art ICs. This corresponds to a 20% to 30% decrease in the IC's power consumption during the maintenance portion of the self-refresh mode. Although the IC's power consumption is higher during the burst portion of the self-refresh mode, one typically starts to realize a power savings after the circuit 20 has been in the self-refresh mode long enough to refresh all of the memory cells one time. This power savings increases the longer the IC remains in the self-refresh mode.

Figure 6:
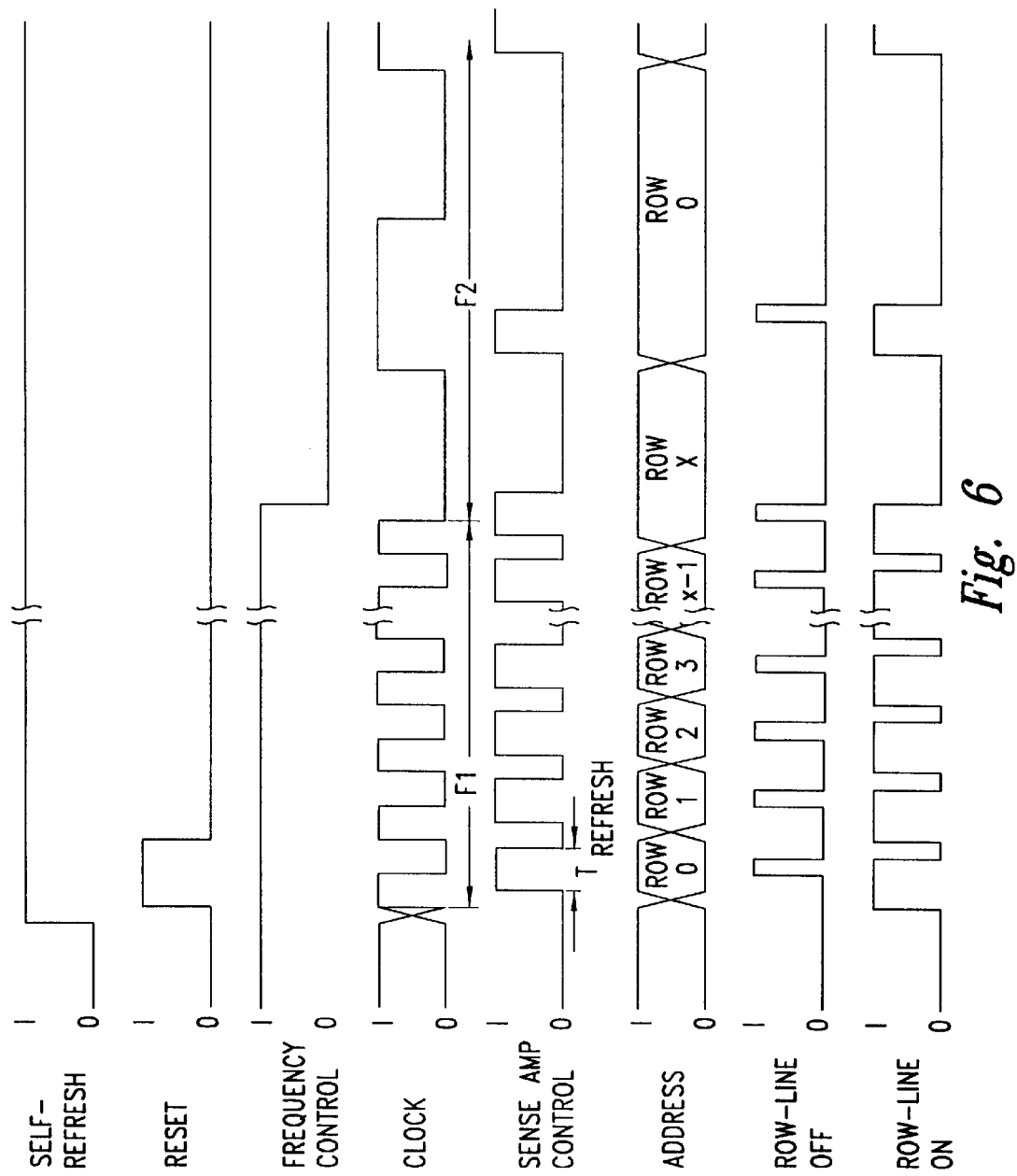
FIG. 6 is a timing diagram for an embodiment of the refresh circuit of FIG. 3.

The operation of the circuit 20 of FIG. 3 is now discussed in conjunction with the timing diagram of FIG. 6. Because the sense-amplifier control circuit 32 typically ignores the PRECHARGE and ACTIVATE signals during a self-refresh mode, these signals are not included in the timing diagram.

The system initiates a self-refresh mode in the IC by transitioning SELF REFRESH from logic 0 to logic 1. In response to this transition, the reset circuit 24 transitions RESET from logic 0 to logic 1 for a predetermined time. In response to this transition of RESET, the address generator 30 resets to an initial address such as 0. In response to the transition of RESET and the logic 1 for FREQUENCY CONTROL, the clock generator 28 generates CLOCK at the burst frequency F1, which is approximately 0.4–0.8 MHz (1/F1=T1=1.25 $\mu$us to 2.5 us) in one embodiment. In response to the rising edges of CLOCK and the logic 1 for SELF REFRESH, the control circuit 32 generates ROW-LINE ON pulses that fire the respective addressed rows in the array 22. The control circuit 32 also generates SENSE-AMP CONTROL pulses having widths of Trefresh, which in one embodiment is approximately 80 ns as stated above to allow the sense amplifiers 34 to fully refresh the memory cells in the array 22. The rising edges of the ROW-LINE ON pulses are typically 5–15 ns before the rising edges of the respective SENSE-AMP CONTROL pulses to allow time for the addressed row to fire before the sense amplifiers 34 are activated. The control circuit 32 also generates ROW-LINE OFF pulses that turn off the addressed rows to end the respective self-refresh cycles. Therefore, the ROW-LINE ON pulse fires ROW 0 of the array 22, and the SENSE-AMP CONTROL pulse causes the sense amplifiers 34 to refresh the memory cells in ROW 0. In response to subsequent rising edges of CLOCK, the address generator 30 increments the row address by one so that the circuit 20 refreshes subsequent rows of memory cells in a similar manner.

When the address generator generates the highest row address X, the frequency control circuit 26 transitions FREQUENCY CONTROL from logic 1 to logic 0. In response to this transition, the clock generator 28 generates CLOCK at a maintenance frequency F2, which is significantly lower than the burst frequency F1, to enter the maintenance portion of the self-refresh mode. The maintenance portion is similar to the burst portion except for the lower CLOCK frequency F2, and lasts until the system "wakes up" the IC by transitioning SELF REFRESH back to logic 0. In one embodiment, F2=F1⁄16 is approximately 25–50 KHz (Trefper=20–40 $\mu$s), for example 33.3 KHz (Trefper=30 $\mu$s). Thus, the maintenance frequency F2 allows the IC to draw less average current during the maintenance portion of the self-refresh mode, and thus allows the IC to consume less power than prior-art ICs during the self-refresh mode. Furthermore, the sense amplifiers 34 refresh the last row, ROW X, in response to the first rising edge of CLOCK in the maintenance portion. That is, ROW X is not refreshed during the burst portion. But this causes no data loss because ROW X is still refreshed well before the data stored in its cells becomes corrupted.

Still referring to FIGS. 3 and 6, although specific embodiments of the refresh circuit 20 are discussed, other embodiments are possible. For example, the active and inactive logic levels of the signals in FIG. 6 may be changed. Furthermore, the address generator 30 may decrement the address instead of incrementing it. Additionally, the circuit 20 may refresh some but not all of the rows during the burst portion of the self-refresh mode. The actual number of rows refreshed during the burst portion is unimportant as long as enough rows are refreshed so that all of the cells in the array 22 can be fully refreshed within the specified refresh period. Moreover, instead of implementing an initial burst portion with a relatively high CLOCK frequency and a subsequent maintenance portion with a lower CLOCK frequency, the circuit 20 may gradually decrease the CLOCK frequency until it reaches the minimum frequency F2. This gradual technique, however, may take longer than the described burst/maintenance technique to realize a power savings.

Figure 7:
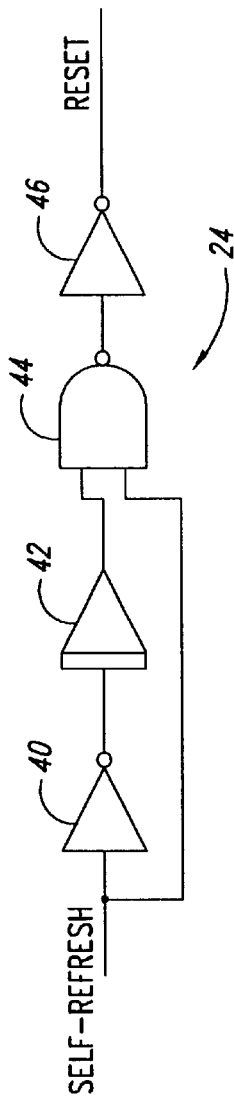
FIG. 7 is a schematic diagram of an embodiment of the reset circuit of FIG. 3.

FIG. 7 is a schematic diagram of an embodiment of the refresh circuit 24 of FIG. 3. The refresh circuit is a "one-shot" that includes an inverter 40, which receives SELF REFRESH and which is serially connected to a delay circuit 42. A NAND gate 44 has one input coupled to the output of the circuit 42 and another input that receives SELF REFRESH. The output of the NAND gate 44 is coupled to the input of an inverter 46, which generates RESET. Before the system initiates the self-refresh mode, RESET equals logic 0 and SELF REFRESH has equaled logic 0 for a significant length of time. If the system transitions SELF REFRESH to logic 1, then the output of the inverter 40 transitions to logic 0. But the delay element 42 maintains its output at logic 1 for a delay period, which equals approximately 1–2 ns in one embodiment Thus, the inputs to the NAND gate 44 are temporarily both at logic 1, the NAND gate generates a logic 0, and the inverter 46 generates logic 1 for RESET. After the delay period of the element 42 has elapsed, the logic 0 at the output of the inverter 40 propagates to the output of the delay 42, the NAND gate 44 generates logic 1, and the inverter 46 generates logic 0 for RESET.

Figure 8:
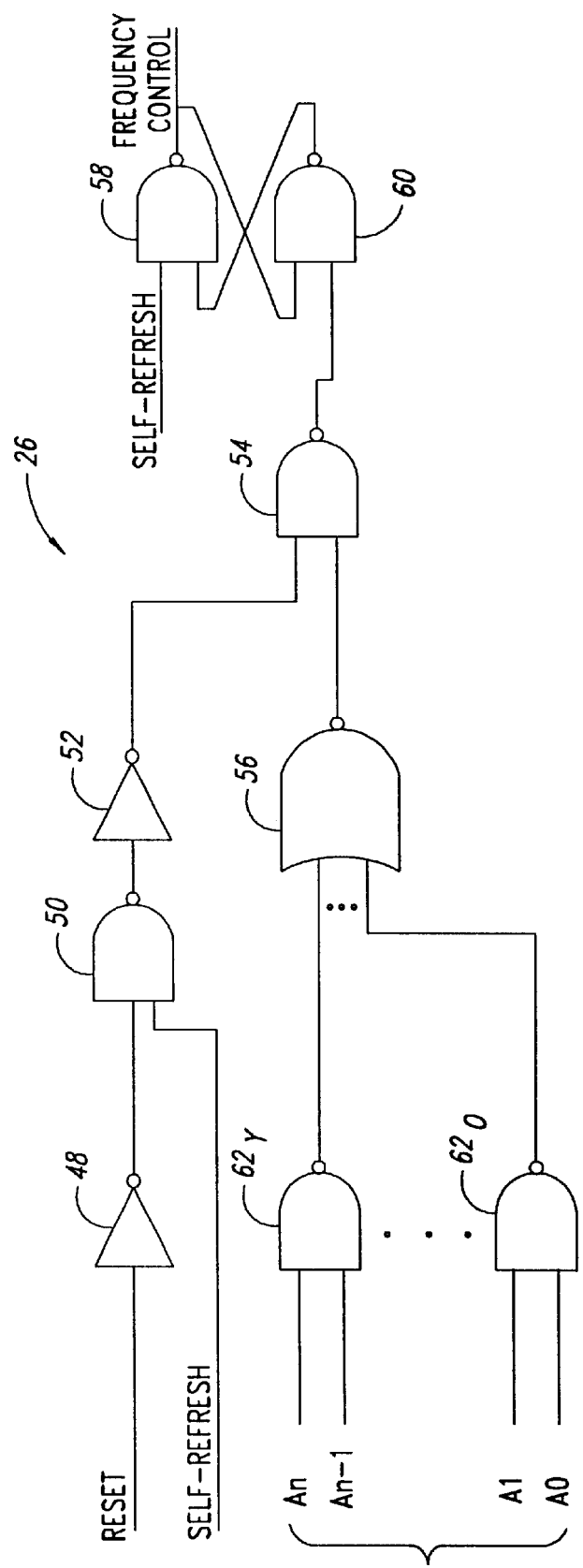
FIG. 8 is a schematic diagram of an embodiment of the frequency-control circuit of FIG. 3.

FIG. 8 is a schematic diagram of an embodiment of the frequency control circuit 26 of FIG. 3. Generally, before the system initiates a self-refresh mode and thus when both RESET and SELF REFRESH equal logic 0, FREQUENCY CONTROL equals logic 1 regardless of the values of the address bits $A_0$—$A_n$ from the address generator 30. Thus, when the system transitions SELF REFRESH to logic 1 to initiate the self-refresh mode, the refresh circuit 20 starts with the burst portion. During the self-refresh mode when the address attains it last value before "turning over", then the circuit 26 transitions FREQUENCY CONTROL to logic 0, thus ending the burst portion and beginning the maintenance portion of the self-refresh mode. In this embodiment, this last address is all of the address bits $A_0$—$A_n$ equaling logic 1, although the circuit 26 can be designed to recognize any address as the last address.

More specifically, before the self-refresh mode when SELF REFRESH and RESET equal logic 0, an inverter 48 and NAND gate 50 each generates logic 1 and an inverter 52 generates logic 0. This logic 0 causes a NAND gate 54 to generate logic 1 regardless of the address-dependent logic value generated by a NOR gate 56. Furthermore, because SELF REFRESH is logic 0, a NAND gate 58 generates logic 1 for FREQUENCY CONTROL regardless of the logic value generated by a NAND gate 60, which is coupled to the NAND gate 58 in a sequential configuration.

After SELF REFRESH transitions to logic 1 and RESET transitions to logic 1 and back to logic 0, but before the address generator 30 reaches the last address, the inverter 48 generates logic 1, the NAND gate 50 generates logic 0, and the inverter 52 generates logic 1. Because the address generator 30 has not reached the last address, at least one of the address bits $A_0$—$A_n$ equals logic 0. Thus, at least one of the NAND gates $62_0$-$62_y$, which each receive a respective pair of the address bits $A_0$—$A_n$, outputs logic 1, and the NOR gate 56 outputs logic 0. This logic 0 causes the NAND gate 54 to continue to generate a logic 1. Because FREQUENCY CONTROL also equals logic 1, the NAND gate 60 generates logic 0, which causes. the NAND gate 58 to maintain FREQUENCY CONTROL at logic 1.

When the address generator reaches the last address, and thus all of the address bits $A_0$—$A_n$ equal logic 1, all of the NAND gates $62_0$-$62_y$ generate logic 0, and the NOR gate 56 generates logic 1. Because the inverter 52 also generates logic 1, the NAND gate 54 generates logic 0, which causes the NAND gate 60 to generate logic 1. Because both SELF REFESH and the output of the NAND gate 60 equal logic 1, the NAND gate 58 transitions FREQUENCY CONTROL to logic 0, thus ending the burst portion of the self-refresh mode.

When SELF REFRESH transitions to logic 0 to end the self-refresh mode, the NAND gate 58 resets FREQUENCY CONTROL to logic 1 in preparation for the next implementation of the self-refresh mode.

Figure 9:
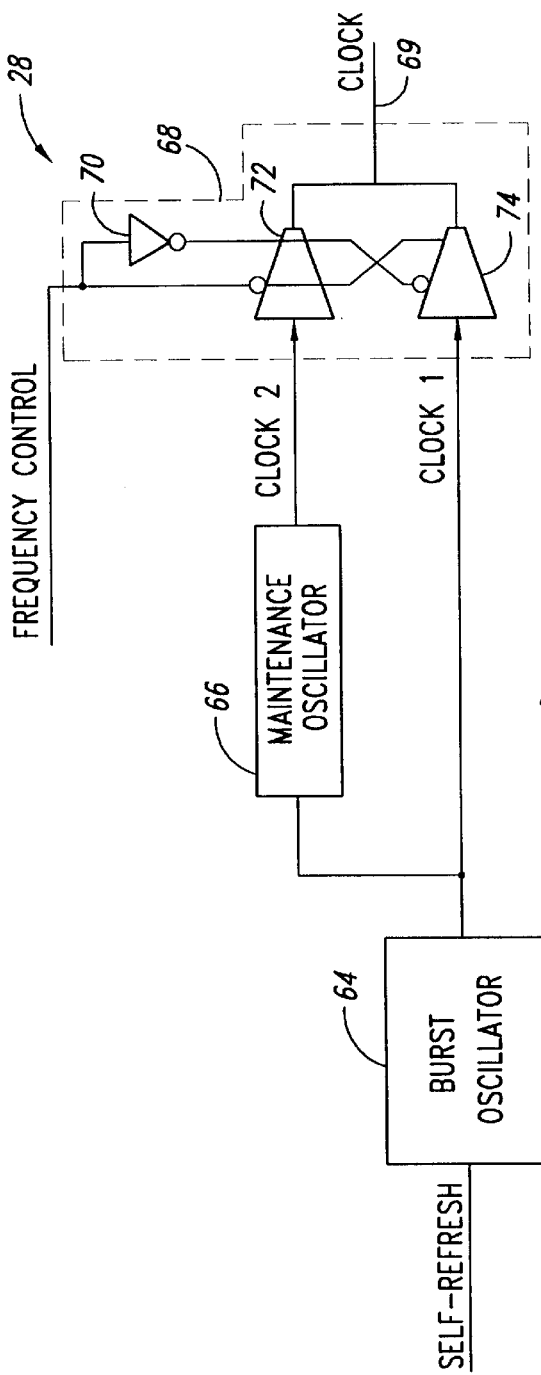
FIG. 9 is a schematic block diagram of an embodiment of the refresh clock generator of FIG. 3.

FIG. 9 is a schematic block diagram of the clock generator 28 of FIG. 3. The generator 28 includes a self-refresh oscillator 64 for receiving SELF REFRESH and for generating a burst clock signal CLOCK1 having the burst frequency F1 if SELF REFRESH equals logic 1. In one embodiment, the oscillator 64 is a conventional ring oscillator. The generator 28 also includes a maintenance oscillator 66 for generating a maintenance clock signal CLOCK2 having the maintenance frequency F2. In one embodiment, the oscillator 66 is a conventional counter. For example, if the oscillator 66 is a 4-bit counter, then it generates $F2=F1/16$. A multiplexer 68 receives FREQUENCY CONTROL, couples CLOCK1 to the clock output terminal 69 as CLOCK if FREQUENCY CONTROL equals logic 1, and couples CLOCK2 to the clock output terminal 69 as CLOCK if FREQUENCY CONTROL equals logic 0. In one embodiment, the multiplexer 68 includes an inverter 70 and conventional switch circuits 72 and 74.

Figure 10:
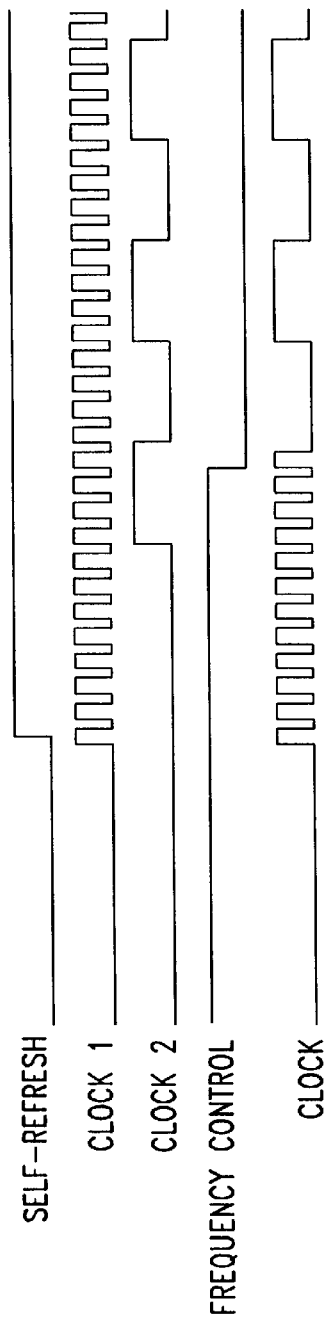
FIG. 10 is a timing diagram for an embodiment of the refresh clock generator of FIG. 9.

The operation of the clock generator 28 is now discussed with reference to FIG. 9 and the timing diagram of FIG. 10.

Before the system initiates a self-refresh mode, SELF REFRESH equals logic 0, which deactivates the burst oscillator 64. Furthermore, FREQUENCY CONTROL equals logic 1, which activates the switch circuit 74 to couple CLOCK1 to the terminal 69 as CLOCK. But because the burst oscillator 64 is inactive, then both CLOCK1 and CLOCK are at a constant logic value, here logic 0.

At the beginning of the self-refresh mode, SELF REFRESH transitions to logic 1, which activates the burst oscillator 64 to generates CLOCK1. FREQUENCY CONTROL is logic 1, which deactivates the switch circuit 72 and activates the switch circuit 74 to couple CLOCK1 to the terminal 69 as CLOCK.

At the end of the burst portion of the self-refresh mode, FREQUENCY CONTROL transitions to logic 0 to enter the maintenance portion of the self-refresh mode. This deactivates the switch circuit 74 and activates the switch circuit 72 to couple CLOCK2 to the terminal 69 as CLOCK.

At a subsequent time, SELF REFRESH transitions to logic 0 to end the self-refresh mode, and FREQUENCY CONTROL transitions to logic 1 in preparation of the next self-refresh mode.

Figure 11:
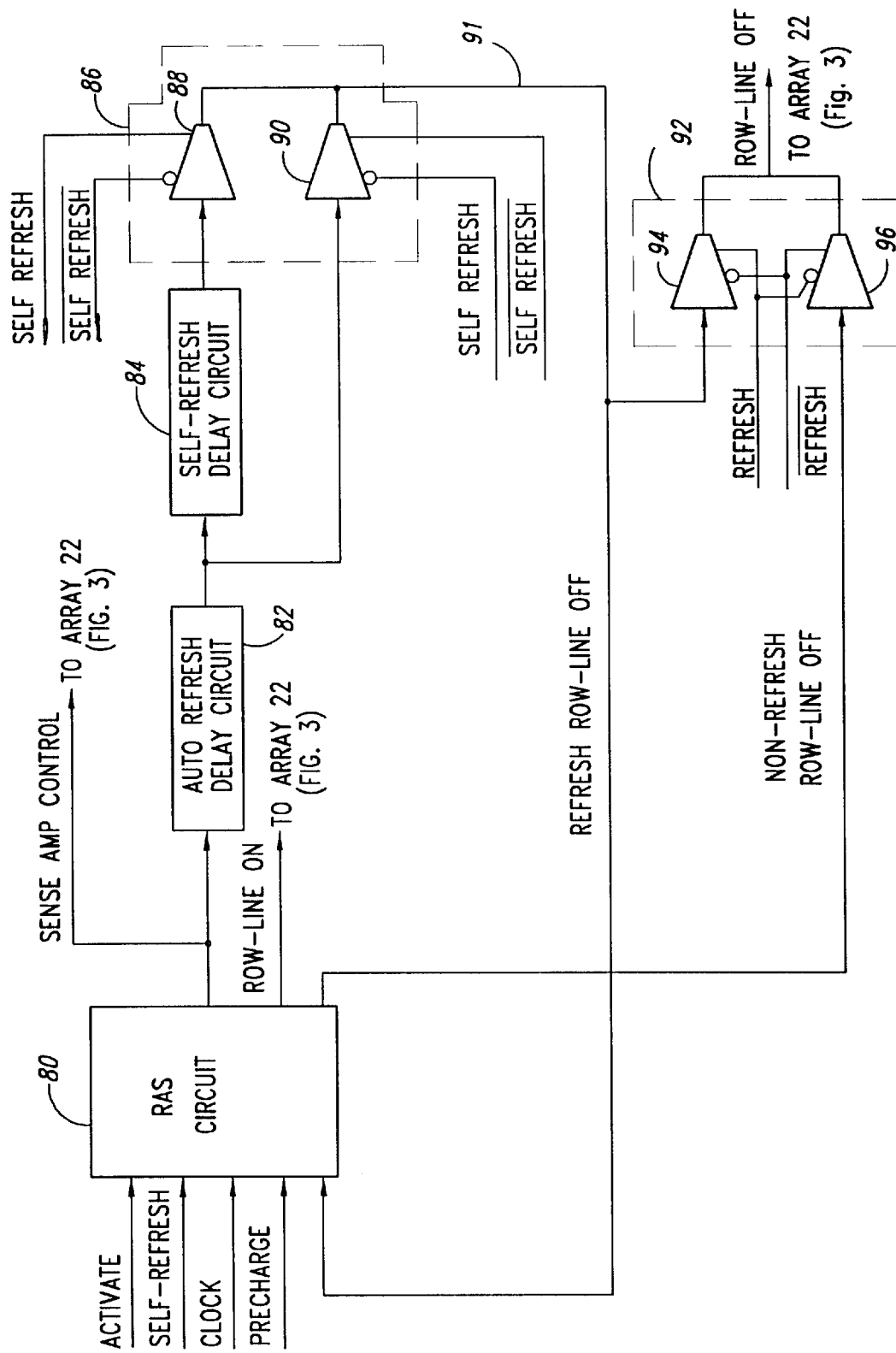
FIG. 11 is a schematic block diagram of an embodiment of the sense-amplifier control circuit of FIG. 3.

FIG. 11 is a block diagram of an embodiment of the sense-amplifier control circuit 32 of FIG. 3. In this embodiment, the circuit 32 generates SENSE-AMP CONTROL during both auto-refresh and self-refresh cycles as well as during non-refresh cycles such as normal read and write cycles.

The circuit 32 includes a RAS circuit 80, which during non-refresh operation generates the SENSE-AMP CONTROL, ROW-LINE ON, and NON-REFRESH ROW-LINE OFF signals in response to the ACTIVATE and PRECHARGE signals in a conventional manner.

During a refresh mode, the control circuit 32 uses a feedback loop that includes the RAS circuit 80, an auto-refresh delay circuit 82, a self-refresh delay circuit 84, and a multiplexer 86. The rising-edge (logic 0 to logic 1) and falling-edge (logic 1 to logic 0) feedback delays of the loop respectively set the pulse width Trefresh of SENSE-AMP CONTROL and the pulse width of ROW-LINE OFF as discussed below.

In addition to the ACTIVATE and PRECHARGE signals, the circuit 80 receives SELF-REFRESH, CLOCK, and REFRESH ROW-LINE OFF, which is the feedback signal. During a refresh mode, the circuit 80 generates the ROW-LINE ON and SENSE-AMP CONTROL pulses in response to SELF-REFRESH and CLOCK.

The auto-refresh delay circuit 82, which is a single-edge delay circuit, delays the rising edge of SENSE-AMP CONTROL for a period that equals the refresh time of an auto-fresh cycle, and imparts little or no delay to the falling edge of SENSE-AMP CONTROL.

The self-refresh delay circuit 84, which is also a single-edge delay circuit, further delays the rising edge of SENSE-AMP CONTROL for an additional period during a self-refresh cycle, and imparts little or no additional delay to the falling edge of SENSE-AMP CONTROL. The sums of the rising-edge delays introduced by the auto-refresh and self-refresh delay circuits 82 and 84 equals the refresh time during a self-refresh cycle. Thus, as discussed above, the self-refresh delay circuit 84 extends the Trefresh time during a self-refresh cycle to allow full refresh of the memory cells in the array 22 (FIG. 3).

The multiplexer 86 includes conventional switch circuits 88 and 90, which receive SELF REFRESH, bypass the self-refresh delay circuit 84 during an auto-refresh cycle, couple the circuit 84 into the feedback loop during a self-refresh mode, and generate REFRESH ROW-LINE OFF on an output terminal 91.

A multiplexer 92 includes conventional switch circuits 94 and 96, which receive a REFRESH signal, couple NON-REFRESH ROW-LINE OFF to the array 22 as the ROW-LINE OFF signal during a non-refresh mode, and couple REFRESH ROW-LINE OFF to the array 22 as the ROW-LINE OFF signal during both a self-refresh and an auto-refresh mode.

Referring to FIGS. 6 and 11, the operation of the sense-amplifier control circuit 32 is discussed.

During an auto-refresh cycle, the rising edge of CLOCK triggers the RAS circuit 80 to generate the rising edge of ROW-LINE ON, which fires the row to be refreshed. After a time sufficient to allow the firing signal to propagate to the end of the fired row line, the circuit 80 generates the rising edge of SENSE-AMP CONTROL, which turns on the appropriate ones of the sense amps 34 (FIG. 3). Because SELF REFRESH equals logic 0, the switch circuit 88 is inactive and the switch circuit 90 is active. The active switch circuit 90 directly couples the output of the auto-refresh delay circuit 82 to the multiplexer output terminal 91. After the auto-refresh delay time, the rising edge of SENSE-AMP CONTROL propagates to the output of the auto-refresh delay circuit 82. In response to this rising edge, the switch circuit 90 generates the rising edge of REFRESH ROW-LINE OFF, which turns off the fired row while the sense amps 34 are on. This rising edge also resets the circuit 80, which, after an inherent internal delay time, generates the falling edge of SENSE-AMP CONTROL, which turns off the sense amps 34. Because the auto-refresh delay circuit 82 provides little or no falling-edge delay, the switch circuit 90 generates the falling edge of REFRESH ROW-LINE OFF soon after the falling edge of SENSE-AMP CONTROL. The circuit 80 is now reset until it receives another rising edge of CLOCK.

In one embodiment, the rising- and falling-edge delays of the RAS circuit 80 are approximately 15 ns, the rising- and falling-edge delays of the auto-refresh delay circuit 82 are approximately 45 ns and 3–5 ns, respectively, and the rising- and falling-edge delays of the switch circuit 90 are less than 1 ns. Therefore, in this embodiment, the total rising-edge delay, i.e., refresh time Trefresh (FIG. 6), during an auto-refresh cycle is approximately 60 ns.

During a self-refresh cycle, the operation of the sense-amplifier control circuit 32 is similar except that SENSE-AMP CONTROL propagates through both the auto-refresh and self-refresh delay circuits 82 and 84. Specifically, the rising edge of CLOCK triggers the RAS circuit 80 to generate the rising edge of ROW-LINE ON, which fires the row to be refreshed. After a time sufficient to allow the firing signal to propagate to the end of the fired row line, the circuit 80 generates the rising edge of SENSE-AMP CONTROL, which turns on the appropriate ones of the sense amps 34 (FIG. 3). Because SELF REFRESH equals logic 1, the switch circuit 90 is inactive and the switch circuit 88 is active. The active switch circuit 88 directly couples the output of the self-refresh delay circuit 84 to the multiplexer output terminal 91. After a delay time that equals the sum of the auto-refresh and self-refresh delay times, the rising edge of SENSE-AMP CONTROL propagates through the auto-refresh and self-refresh delay circuits 82 and 84 to the input of the switch circuit 88. In response to this rising edge at its input, the switch circuit 88 generates the rising edge of REFRESH ROW-LINE OFF, which turns off the fired row while the sense amps 34 are on. This rising edge also resets the circuit 80, which, after an inherent internal delay time, generates the falling edge of SENSE-AMP CONTROL, which turns off the sense amps 34. Because the auto-refresh and self-refresh delay circuits 82 and 84 provide little or no falling-edge delays, the switch circuit 88 generates the falling edge of REFRESH ROW-LINE OFF soon after the falling edge of SENSE-AMP CONTROL. The circuit 80 is now reset until it receives another rising edge of CLOCK.

In one embodiment, the rising- and falling-edge delays of the self-refresh delay circuit 84 are approximately 20 ns and 3–5 ns, respectively, and the rising-and falling-edge delays of the switch circuit 88 are less than 1 ns. Therefore, in this embodiment, the total rising-edge delay, i.e., refresh time Trefresh (FIG. 6), during a self-refresh cycle is approximately 80 ns, which is approximately 20 ns longer than during an auto-refresh cycle. This extra 20 ns is sufficient to allow the sense amplifiers 34 (FIG. 3) to fully refresh the memory cells in the array 22! That is, this extra 20 ns allows sufficient time to charge a cell to the maximum voltage Vdd or to discharge the cell to the minimum voltage 0.

Figure 12:
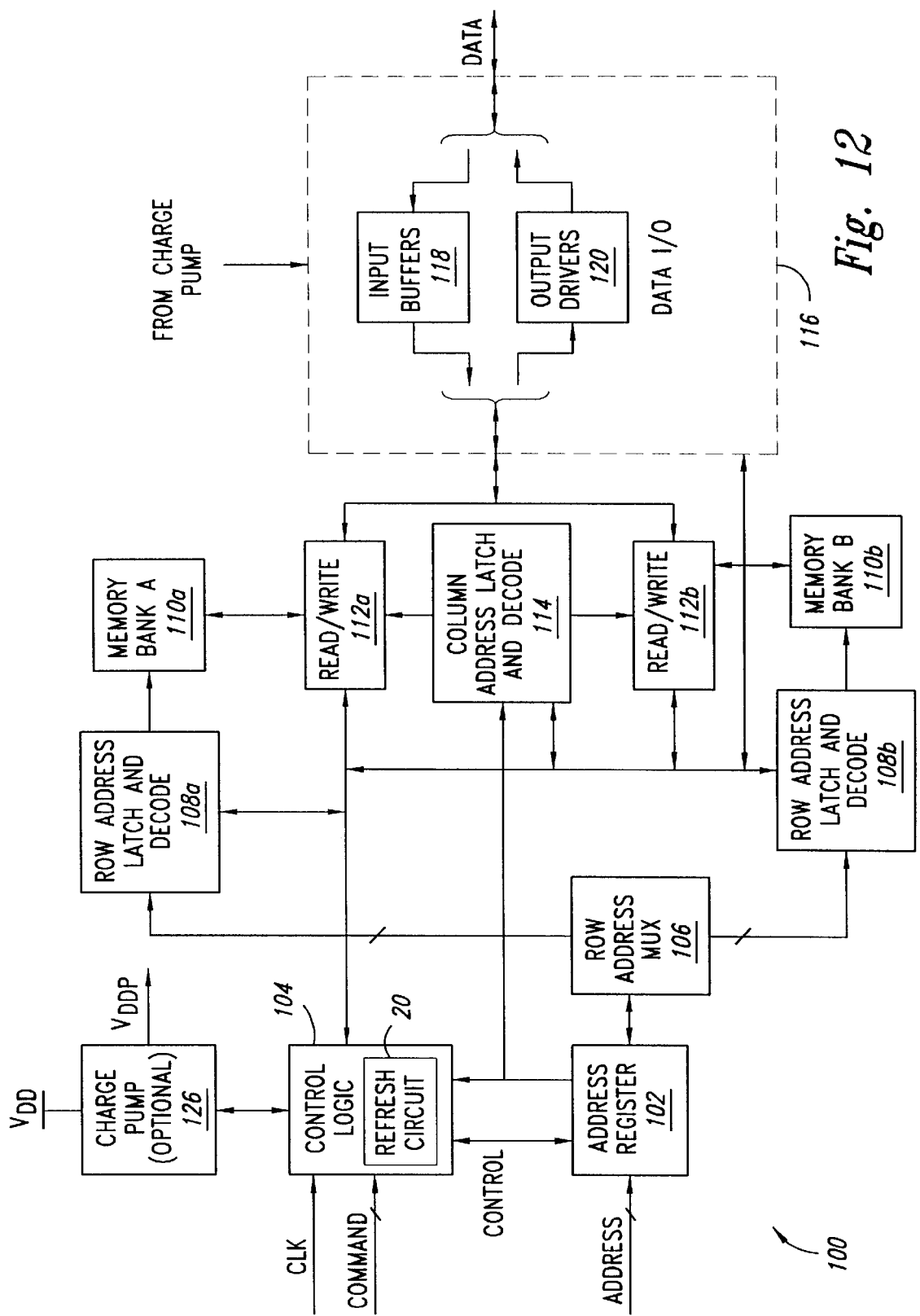
FIG. 12 is a block diagram of an embodiment of a memory circuit that includes the refresh circuit and memory array of FIG. 3.

FIG. 12 is a block diagram of an embodiment of a memory circuit 100, which includes the refresh circuit 20 of FIG. 3.

The memory circuit 100 includes an address register 102, which receives an address from an ADDRESS bus. A control logic circuit 104 receives an external clock (CLK) signal, and receives clock enable (CKE), chip select, chip select ($\overline{CS}$), row address strobe ($\overline{RAS}$), column address strobe ($\overline{CAS}$), write enable ($\overline{WE}$), and the SELF REFRESH signals from the COMMAND bus, and communicates with the other circuits of the memory device 100. In the illustrated embodiment, the control circuit 104 includes the refresh circuit 20, although the refresh circuit 20 may be located elsewhere in other embodiments.

A row address multiplexer 106 receives the address signal from the address register 102 and provides the row address to the row-address latch-and-decode circuits 108a and 108b for the memory bank 110a or 110b, respectively. During read and write cycles, the row-address latch-and-decode circuits 108a and 108b activate the word lines of the addressed rows of memory cells in the memory banks 120a and 120b, respectively. Read/write circuits 112a and 112b read data from the addressed memory cells in the memory banks 110a and 110b, respectively, during a read cycle, and write data to the addressed memory cells during a write cycle. A column-address latch-and-decode circuit 114 receives the address from the address register 102 and provides the column address of the selected memory cells to the read/write circuits 112a and 112b. For clarity, the address register 102, the row-address multiplexer 106, the row-address latch-and-decode circuits 108a and 108b, and the column-address latch-and-decode circuit 114 can be collectively referred to as an address decoder.

A data input/output (110) circuit 116 includes a plurality of input buffers 118. During a write cycle, the buffers 108 receive and store data from the DATA bus, and the read/write circuits 112a and 112b provide the stored data to the memory banks 110a and 100b, respectively. The data I/O circuit 116 also includes a plurality of output drivers 120. During a read cycle, the read/write circuits 112a and 112b provide data from the memory banks 110a and 110b, respectively, to the drivers 120, which in turn provide this data to the DATA bus.

The memory device 100 may also include an optional charge pump 126, which steps up the power-supply voltage $V_{DD}$ to a voltage $V_{DDP}$. In one embodiment, the pump 126 generates $V_{DDP}$ approximately 1–1.5 V higher than $V_{DD}$. The memory circuit 100 may also use $V_{DDP}$ to conventionally overdrive selected internal transistors.

Figure 13:
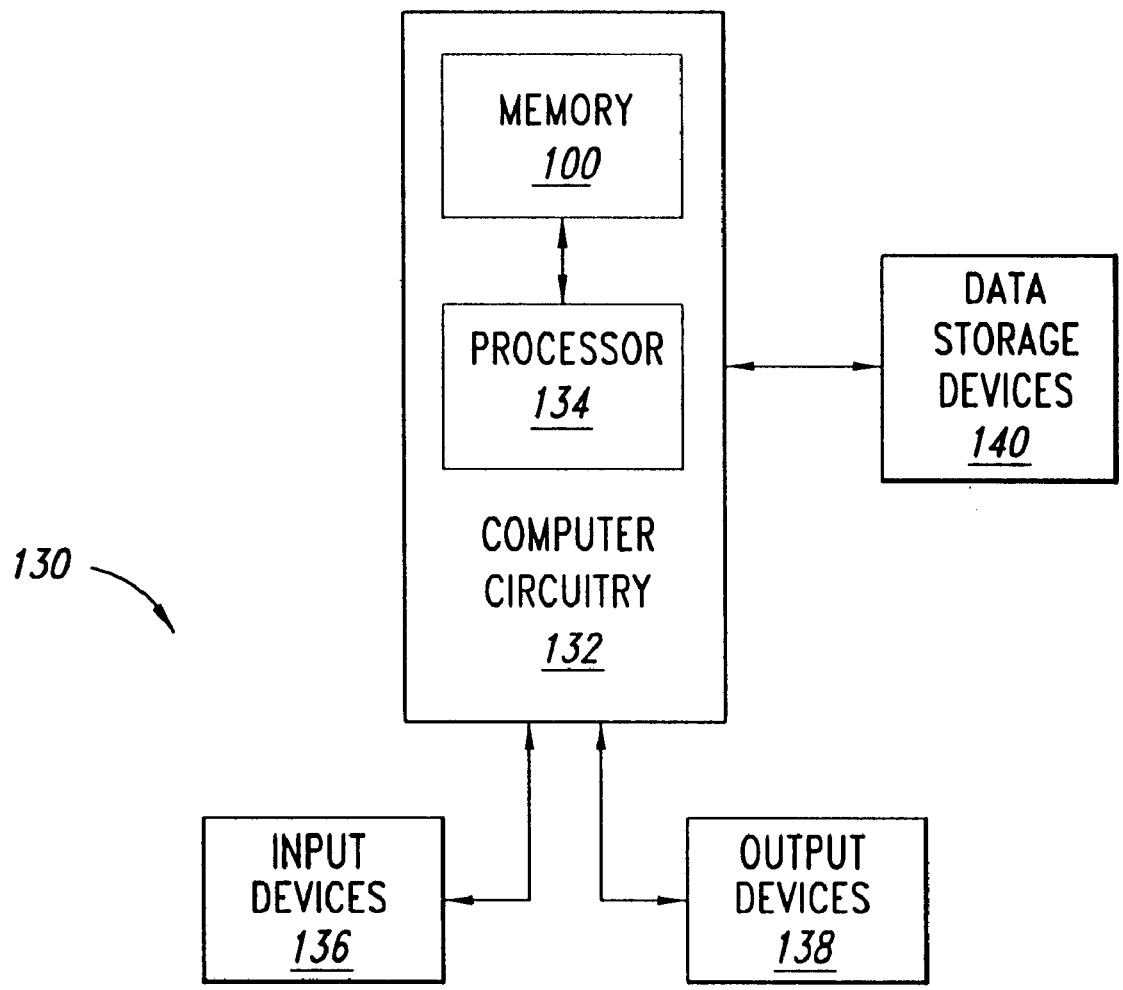
FIG. 13 is a block diagram of an embodiment of an electronic system that includes the memory circuit of FIG. 12.

FIG. 13 is a block diagram of an electronic system 130, such as a computer system, that incorporates the memory circuit 100 of FIG. 12. The system 130 includes computer circuitry 132 for performing computer functions, such as executing software to perform desired calculations and tasks. The circuitry 132 typically includes a processor 134 and the memory circuit 100, which is coupled to the processor 134. One or more input devices 136, such as a keyboard or a mouse, are coupled to the computer circuitry 132 and allow an operator (not shown) to manually input data thereto. One or more output devices 138 are coupled to the computer circuitry 132 to provide to the operator data generated by the computer circuitry 132. Examples of such output devices 138 include a printer and a video display unit. One or more data-storage devices 140 are coupled to the computer circuitry 132 to store data on or retrieve data from external storage media (not shown). Examples of the storage devices 140 and the corresponding storage media include drives that accept hard and floppy disks, tape cassettes, and compact disk read-only memories (CD-ROMs). Typically, the computer circuitry 132 includes address data and command buses and a clock line that are respectively coupled to the ADDRESS, DATA, and COMMAND buses, and the CLK line of the memory circuit 100.

From the foregoing it will be appreciated that, although specific embodiments of the invention have been described herein for purposes of illustration, various modifications may be made without deviating from the spirit and scope of the invention.

What is claimed:

1. A method, comprising:
   fully or substantially fully refreshing data stored in memory cells at a first frequency during a first portion of a refresh mode; and
   fully or substantially fully refreshing data stored in the memory cells at a second frequency during a second portion of the refresh mode.

2. The method of claim 1 wherein the refresh mode comprises a self-refresh mode.

3. The method of claim 1 wherein:
   the first portion comprises an initial portion of the refresh mode; and
   the first frequency is significantly higher than the second frequency.

4. The method of claim 1 wherein fully or substantially fully refreshing stored data during the first and second portions of the refresh mode comprises restoring the stored data to substantially full signal levels.

5. The method of claim 1 wherein the first frequency is higher than the second frequency.

6. A method, comprising:
   refreshing data stored in a memory cell for a first duration during a refresh cycle of a first refresh mode; and
   refreshing data stored in the memory cell for a second duration during a refresh cycle of a second refresh mode, the second duration being different than the first duration.

7. The method of claim 6 wherein:
   the second duration is significantly longer than the first duration;
   the first refresh mode comprises an auto-refresh mode; and
   the second refresh mode comprises a self-refresh mode.

8. The method of claim 6 wherein:
   refreshing the stored data for the first duration comprises partially refreshing the stored data; and
   refreshing the stored data for the second duration comprises fully or substantially fully refreshing the stored data.

9. A method, comprising:
   during a first refresh mode, refreshing data stored in memory cells for a first duration and at a first frequency;
   during a first portion of a second refresh mode, refreshing data stored in the memory cells for a second duration and at a second frequency; and
   during a second portion of the second refresh mode, refreshing data stored in the memory cells for a third duration at a third frequency.

10. The method of claim 9 wherein:
    the first refresh mode comprises an auto-refresh mode; and
    the second refresh mode comprises a self-refresh mode.

11. The method of claim 9 wherein the first duration is shorter than the second and third durations.

12. The method of claim 9 wherein the third duration equals the second duration.

13. The method of claim 9 wherein the second and third durations are long enough to allow full or substantially full refreshing of data.

14. The method of claim 9 wherein the data stored in the memory cells during the first refresh mode is different from the data stored in the memory cells during the first or second portion of the second refresh mode.

15. The method of claim 9 wherein the data stored in the memory cells during the first portion of the second refresh mode is the same as the data stored in the memory cells during the second portion of the second refresh mode.

* * * * *